United States Patent
Miyazaki et al.

[11] Patent Number: 5,248,904
[45] Date of Patent: Sep. 28, 1993

[54] SWITCHING REGULATOR SOFT START CIRCUIT

[75] Inventors: Hajime Miyazaki; Masaaki Handa; Tajsuke Uehara; Tsukasa Muranaka, all of Suwa, Japan

[73] Assignee: Seiko Epson Corporation, Tokyo, Japan

[21] Appl. No.: 963,888

[22] Filed: Oct. 19, 1992

Related U.S. Application Data

[62] Division of Ser. No. 644,704, Jan. 23, 1991, Pat. No. 5,157,699.

[30] Foreign Application Priority Data

| Jan. 23, 1990 | [JP] | Japan | 2-11843 |
| Jan. 31, 1990 | [JP] | Japan | 2-19243 |
| Jun. 29, 1990 | [JP] | Japan | 2-170285 |
| Jun. 29, 1990 | [JP] | Japan | 2-170286 |

[51] Int. Cl.$^5$ .................................. H03K 3/72
[52] U.S. Cl. ............................ 307/271; 307/593; 328/61
[58] Field of Search .............. 307/271, 593; 328/61

[56] References Cited

U.S. PATENT DOCUMENTS

| 4,020,366 | 4/1977 | Garner et al. | 307/271 |
| 4,095,407 | 6/1978 | Asano et al. | 307/593 |
| 4,365,203 | 12/1982 | DiMassimo et al. | 307/271 |
| 4,471,452 | 9/1984 | Borchert | 307/271 |
| 4,595,848 | 6/1986 | Ryczek | 307/593 |
| 4,606,058 | 8/1986 | Kruger et al. | 307/593 |
| 4,649,886 | 3/1987 | Igashira et al. | 123/498 |

Primary Examiner—John S. Heyman
Attorney, Agent, or Firm—Gregory D. Ogrod

[57] ABSTRACT

A switching regulator soft start circuit and technique which eliminates variations in frequency and is capable of more appropriately preselecting a suitable operating frequency by using a timer which responds to a start signal by generating an initial condition release signal after a predetermined interval, a frequency divider for obtaining a desired oscillation frequency from the output of a switching regulator, and a first gate element connected to receive the output of the frequency divider and the initial condition release signal, and to provide as an output a gate control signal that varies in frequency corresponding to the frequency divider output whenever the initial condition release signal is off but provides a gate control that delivers undivided switching regulator signals when the initial condition release signal is on; and a gate circuit connected to receive oscillation frequency signals and the gate control signal to control the delivery of output signals.

8 Claims, 3 Drawing Sheets

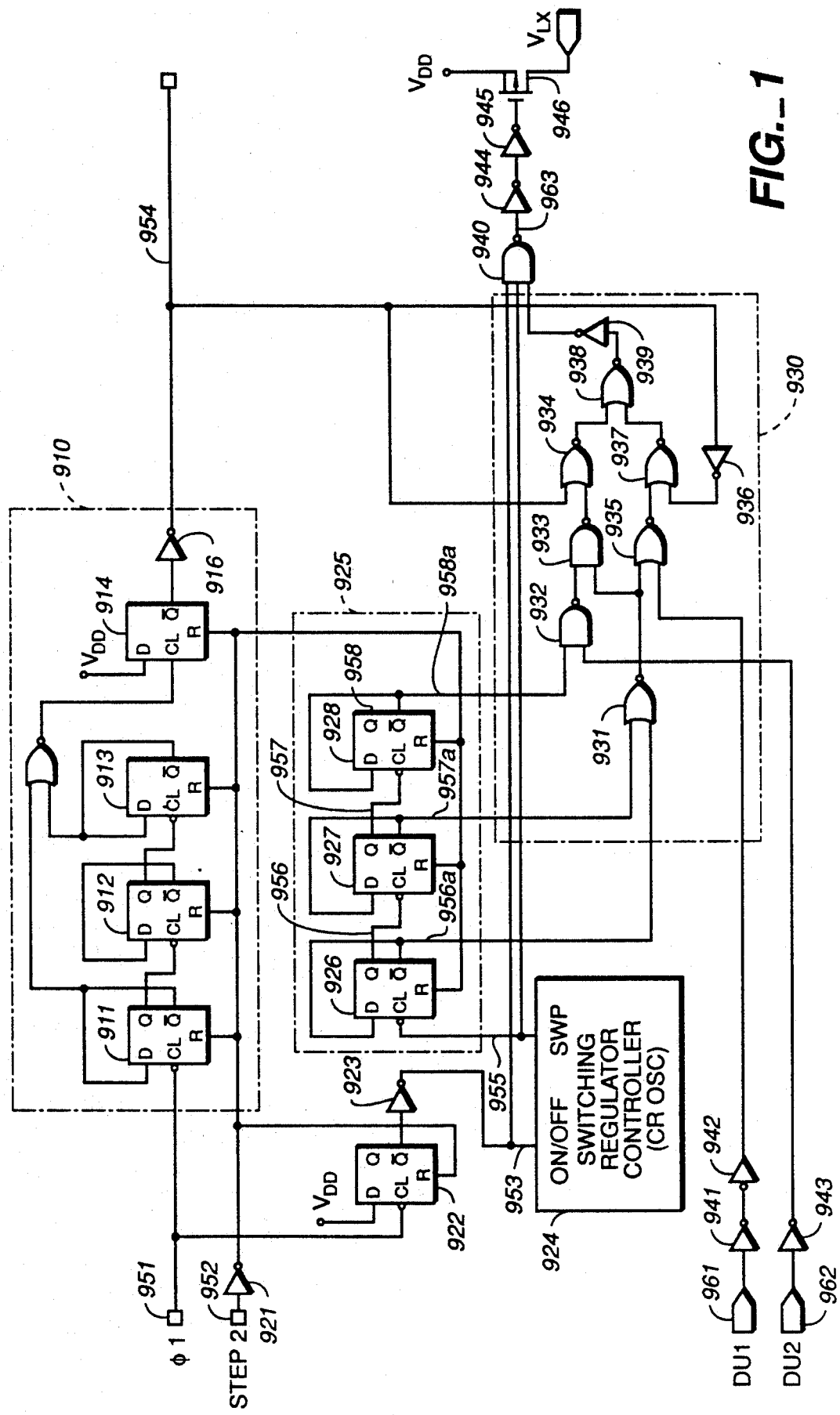
FIG._1

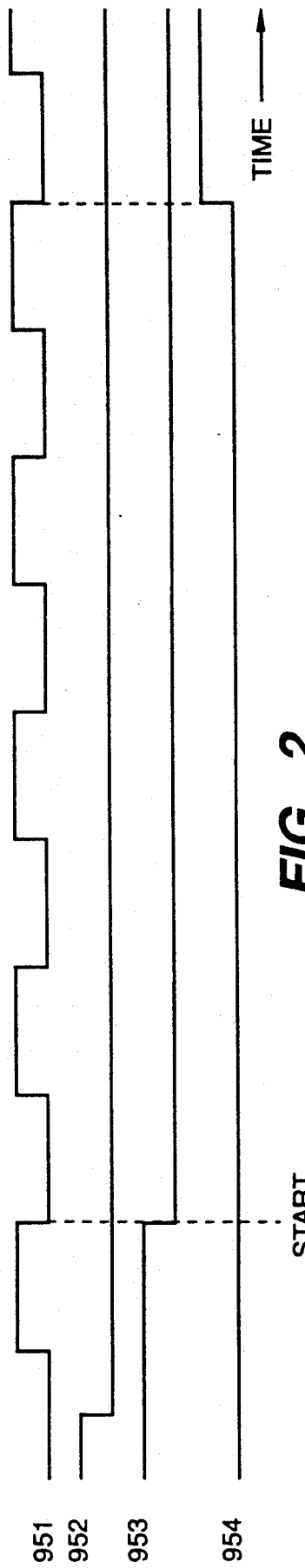
FIG._2
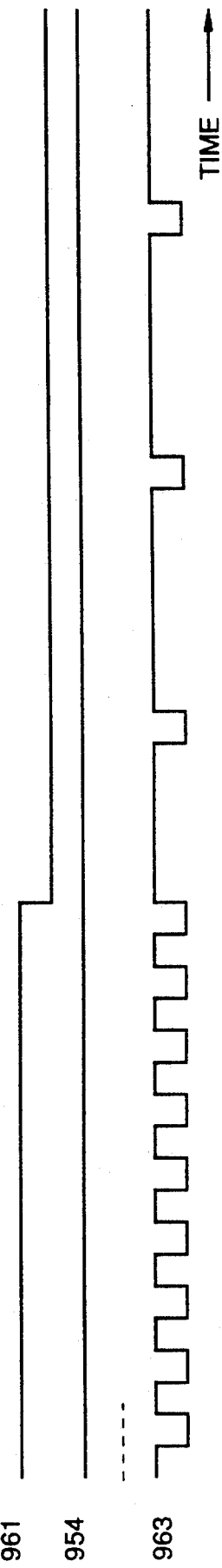
FIG._4

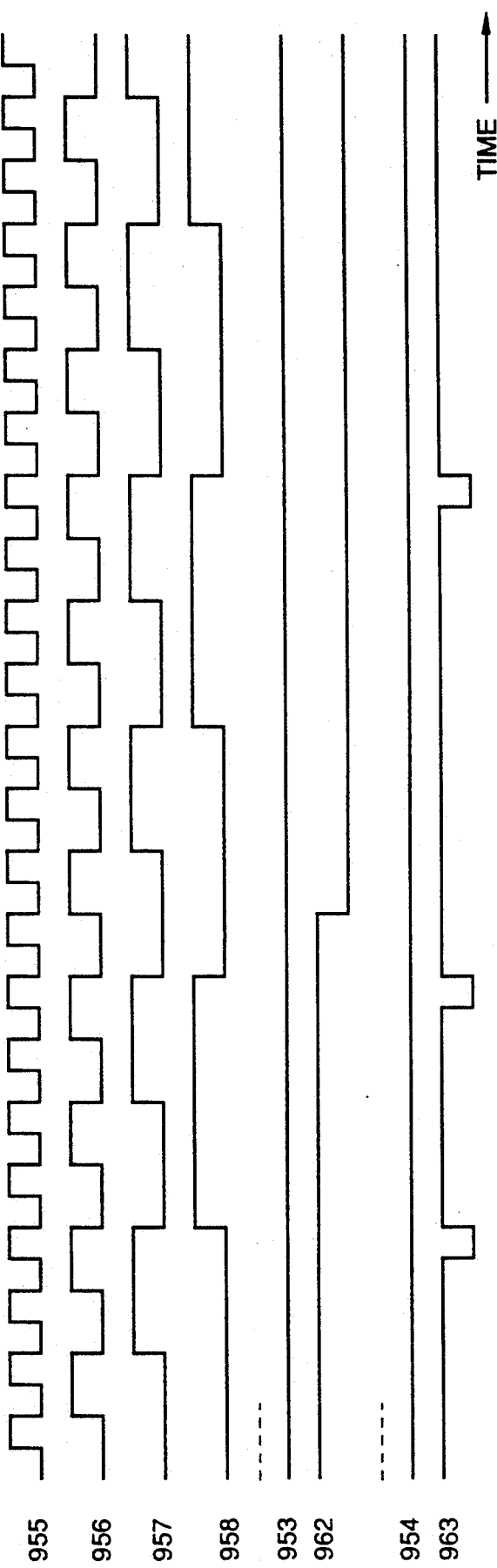
FIG._3

SWITCHING REGULATOR SOFT START CIRCUIT

This is a division, of application Ser. No. 07/644,704 filed on Jan. 23, 1991 now U.S. Pat. No. 5,157,699.

BACKGROUND OF THE INVENTION

The present invention relates to switching regulators and more particularly to a soft start circuit for such regulators.

Electronic apparatus such as supervisory control circuits for two valve-type micropumps, as disclosed, for example, in U.S. patent application Ser. No. 07/599,298 in the name of Hajime Miyazaki et al., filed Oct. 17, 1990, the disclosure of which is hereby incorporated by reference, are capable of exercising precise flow control in trace amounts. Therefore, such valves and control circuits are particularly suited for medical care applications, such as the administration of insulin to diabetics, and chemical analysis. Where such control circuits, or micropumps, are intended for medical applications, safety and reliability present important problems. Frequency control and regulation in current control systems for such sensitive applications have proven to be less accurate or reliable than desired. It has proven difficult to maintain adequate frequency regulation during initial power up when power supply voltages have not yet stabilized under a sudden load. The selection and control over start up frequency is typically too variable and prone to error. Therefore, what is needed is a new method and apparatus for providing adequate switching regulation for such control circuits.

SUMMARY OF THE INVENTION

It is one object of the present invention to provide a soft start circuit for a switching regulator which is free of frequency variations and capable of suitable frequency selection.

In accordance with one aspect of the present invention, a soft start circuit for a switching regulator is provided which includes a timer that responds to the application of a start signal by generating an initial condition release signal after expiration of a given time period, a frequency divider circuit for dividing an oscillator output frequency down to a lower frequency, a gate control circuit for receiving the output of the frequency divider circuit and the initial condition release signal and for generating a gate control signal operating at a frequency dependent on the frequency divider output when the initial condition release signal is off and a gate control signal for delivering all input signals when the initial condition release signal is on, and a gate circuit for receiving the oscillation frequency signals and the gate control signal to control the transfer of output signals.

According to another aspect of the present invention, the switching regulator soft start circuit comprises a timer responsive to the application of a start signal to generate an initial condition release signal after expiration of a given time period, a frequency divider circuit for dividing down a switching regulator output frequency, in multiple steps, to provide a plurality of frequency divided outputs, a gate control circuit for receiving the plurality of frequency divided outputs from the frequency divider circuit, the initial condition release signal and a first control signal thereby providing a gate control signal formed by combining the plurality of frequency divided outputs in accordance with the first control signal when the initial condition release signal is off and for providing a continuous gate control signal for enabling transmission of undivided switching regulator output or frequency divided signals when the initial condition release signal is on, and a gate circuit for receiving the oscillation frequency signals and the gate control signal for controlling delivery of output signals.

According to still another aspect of the present invention the switching regulator soft start circuit comprises, in place of the above-mentioned gate control circuit, a gate control circuit for receiving a plurality of frequency divided outputs from the frequency divider circuit, the initial condition release signal, the first control signal, and a second control signal thereby providing to the gate circuit a first gate control signal formed by combining the plurality of frequency divided outputs according to the first control signal when the initial condition release signal is off and providing to the gate circuit a second gate control signal formed by combining the plurality of frequency divided outputs according to the second control signal when the initial condition release signal is on, the frequency of the second gate control signal being higher than the frequency of the first gate control signal.

With the above-mentioned switching regulator, in an initial operating mode or condition the gate circuit delivers output signals based on the frequency divided outputs of the frequency divider circuit in accordance with the then current gate control signal. Also, in a steady-state mode or condition the gate circuit generates signals at the oscillation frequency or outputs signals at a frequency higher than that of the initial mode.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a circuit diagram of a soft start circuit for a switching regulator constructed and operating according to the present invention.

FIG. 2 is a timing chart showing the operation of timer and flip-flop circuits in the soft start circuit of FIG. 1.

FIG. 3, illustrates the timing for operation of the circuit of FIG. 1 in an initial condition or mode.

FIG. 4 illustrates the timing for operation of the circuit of FIG. 1 in a steady-state mode.

DESCRIPTION OF THE INVENTION

The present invention involves the application of a soft start circuit for switching regulator type power controls as are found in apparatus such as micropump supervisory control circuits. The soft start circuit of the invention uses a timer that responds to a start signal by generating an initial condition release signal, a frequency divider for providing stepped down frequencies from a switching regulator output, and a first gate control circuit which receives the divided frequencies and the initial condition release signal, and outputs a gate control signal. The gate control signal is operated at a frequency corresponding to the frequency of the divider output whenever the initial condition release signal is off but as a signal which delivers undivided switching regulator output signals when the initial condition release signal is on. The gate control signal is provided to a gate circuit connected to receive switching regulator output frequency signals and the gate control signal.

A description follows of a soft start circuit for a switching regulator incorporated in apparatus such as a micropump supervisory control circuit constructed according to the present invention. FIG. 1 is a circuit diagram showing a soft start circuit for such use according to one embodiment of the present invention. A timer circuit 910 for generating an initial condition release signal includes D-type flip-flop circuits 911-914, gate circuit 915, inverter 916, inverter circuits 921, 923, and D-type flip-flop circuit 922. A switching regulator controller 924 for receiving a driving command signal through inverter circuits 921, 923, and D-type flip-flop circuit 922 is also shown.

A frequency divider circuit 925 also uses second D-type flip-flop circuits 926-928 for dividing the oscillation frequency of switching regulator controller 924, gate control circuit 930 including logical gate circuits 931-935, 937, 938, and inverters 936 and 939, gate circuit 940 comprising a NAND circuit, inverter circuits 941-945, and switching transistor 946.

FIG. 2 is a timing chart showing the operation of timer circuit 910 and D-type flip-flop circuit 922. When clock signals 951 having a frequency of 1 Hz are applied to the clock terminal of D-type flip-flop circuits 911 and 922, and start signal 952 goes to a high or H level in this condition, start signal 952 is inverted by inverter circuit 921 and is applied to the reset terminals of several D-type flip-flop circuits 911-914, and 922, thereby releasing the resetting of these circuits. D-type flip-flop circuit 922 latches an input of the data terminal at the falling edge of clock signal 951 and outputs its inverted output as driving command signal 953 to a switching regulator controller 924 through an inverter 923.

In timer circuit 910, clock signals 951 are subjected to ¼ frequency division so that the resulting output is applied as the clock signal to the clock terminal of D-type flip-flop circuit 914 and then delivered as an initial condition release signal 954 through an inverter 916. Initial condition release signal 954 remains at a low or L level for about 4 seconds following application of start signal 952. During this interval, a gate control circuit 930 operates in an initial mode or condition. At the expiration of 4 seconds, initial condition release signal 954 goes to the H level so that the initial condition is released and gate control circuit 930 operates in a steady-state mode or condition.

FIG. 3 is a timing chart showing circuit operation in an initial condition or mode. Oscillation pulses 955 from switching regulator controller 924 are applied to frequency divider circuit 925 so that pulses 955 are subjected to frequency division by D-type flip-flop circuits 926-928 and output signals 956-958, respectively, are produced. At this time, it is assumed that control signal 961 operating at the H or L level has been applied and control signal 962 at the H level has been applied. Note that control signal 961 is a signal for determining the frequency of the output in the steady state mode and control signal 962 is a signal for determining the frequency of the output in the initial mode. Frequency divider circuit 925 operates in such a manner that when control signal 962 is at the H level, the frequency of oscillation pulses 955 is subjected to ¼ frequency division and an output at the resulting frequency is generated. When control signal 962 is at the L level, the frequency of oscillation pulses 955 is subjected to ⅛ frequency division and an output at the resulting frequency is generated.

Inverted output signals 956a and 957a from D-type flip-flop circuits 926 and 927 of frequency divider circuit 925 are applied to a NOR circuit 931 of gate control circuit 930. Inverted output signal 958a of D-type flip-flop circuit 928 and inverted control signal 962 through inverter circuit 943 are applied to NAND circuit 932. While the output of NOR circuit 931 and NAND circuit 932 are applied to NAND circuit 933, the output of NAND circuit 932 is fixed at the H level, having the effect that the output signal of D-type flip-flop circuit 928 is thereafter ignored, and the output of NAND circuit 933 is the inverted output signal of the output from NOR circuit 931. Initial condition release signal 954 ("L" level at this time) being applied to NOR circuit 934 generates as an output signal the inverted signal of the output of NAND circuit 933.

Initial condition release signal 954 is applied to NOR circuit 937 through inverter circuit 936 so that its output is fixed at the L level and control signal 961 is ignored. The output of NOR circuit 934 and the output (L) of NOR circuit 937 are applied to NOR circuit 938. The inverted signal of NOR circuit 934 is delivered as a gate control signal through inverter 939.

Drive command signal 953, oscillation pulses 955, and the above-mentioned gate control signal are applied to a gate circuit 940 which generates output signals 963 having the same pulse width as oscillation pulses 955, and a new frequency is obtained by dividing the frequency of oscillation pulses 955 by a factor of 4, thereby driving a switching transistor 946 through inverters 944 and 945.

When control signal 962 goes to the L level, an H level signal is applied to NAND circuit 932 so that it generates an inverted signal of inverted output signal 958a from D-type flip-flop circuit 928 and the previously mentioned operation for delivering output signals 963 is performed, thereby delivering signals 963 having the same pulse width as oscillation pulses 955 and a frequency obtained by dividing the frequency of oscillation pulses 955 by a factor of 8. During the initial condition or during the time that the initial condition release signal 954 remains at the L level, output pulses of ¼ or ⅛ of the frequency of oscillation pulses 955 are generated.

FIG. 4 is a timing chart showing operation in the steady-state condition or mode. In steady-state mode, it is assumed that initial condition release signal 954 is a the H level and control signal 961 is set to the H level. Control signal 961 (the "H" level) is applied to NOR circuit 935 through inverters 941 and 942 so that its output is fixed at the L level, and the "L" output of NOR circuit 935 and inverted initial condition release signal 954 through inverter 936 are applied to NOR circuit 937, thus causing its output to go the H level. When this occurs, a gate control signal (the "H" level at this time) is delivered to gate circuit 940 through NOR circuit 938 and inverter 939. The inverted signals of oscillation pulses 955 are delivered as output signals 963 from gate circuit 940.

Where control signal 961 is set to the L level, initial condition release signal 954 (the H level at this time) is applied to NOR circuit 934 thus holding its output at the L level and control signal 961 is applied to NOR circuit 935 through inverters 941 and 942. The inverted signal of the output from NOR circuit 931 is delivered to the following circuits and the previously mentioned operation is performed. Gate control signals resulting from ¼ frequency division of oscillation pulses 955 and having a pulse width which is two times that of oscillation pulses 955 are supplied to gate control 940. Gate control circuit 940 generates output signals 963 which are ¼ of the frequency and the same pulse width as oscillation pulses 955.

While, in the above-mentioned embodiment, the duration of the initial condition or mode is set at 4 seconds, an alternative time period can be selected as desired and the corresponding output frequency determined arbitrarily.

From the foregoing description it will be seen that since the switching regulator is designed so that its output frequency can be arbitrarily changed between an initial condition and a steady-state condition, the output frequency can be increased after the power supply voltage has risen fully. Moreover there is no frequency variation resulting from such digital processing and the frequency can be suitably set.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A switching regulator soft start circuit for use in a micropump supervisory control apparatus comprising:
    a timer responsive to the application of a start signal to generate an initial condition release signal after a predetermined time period;
    a frequency divider circuit for dividing an oscillation frequency by at least one predetermined amount to produce one or more lower frequencies;
    a gate control circuit for receiving output signals of said frequency divider circuit and said initial condition release signal so as to generate a gate control signal having a frequency dependent on the output signal of said frequency divider circuit when said initial condition release signal is off and so as to generate a gate control signal for delivering undivided oscillation frequency signals when said initial condition release signal is on; and
    a gate circuit for receiving said oscillation frequency signals and a gate control signal from said gate control circuit to deliver output signals.

2. A switching regulator soft start circuit comprising:
    a timer responsive to the application of a start signal to generate an initial condition release signal after the expiration of a predetermined time period;
    a frequency divider circuit for subjecting an input oscillation frequency signal to multiple frequency divisions of predetermined factors so as to deliver a plurality of frequency divided outputs;
    control means for generating a first control signal useful for selecting operating states for the soft start circuit;
    a gate control circuit for receiving the frequency divided outputs from said frequency divider circuit, said initial condition release signal, and said first control signal, and for delivering a gate control signal produced by logically combining said frequency divided outputs in accordance with said first control signal when said initial condition release signal is on and by delivering a fixed signal when said initial condition release signal is absent; and
    a gate circuit for receiving said oscillation frequency signal and said gate control signal and generating a gate control output signal.

3. The switching regulator soft start circuit of claim 2, wherein:
    said gate control circuit receives the frequency divided outputs from said frequency divider circuit, said initial condition release signal, a first control signal, and a second control signal, and configured to deliver a first gate control signal produced by combining said plurality of frequency divided outputs in accordance with said first control signal when said initial condition release signal is off, and to deliver a second gate control signal produced by combining said plurality of frequency divided outputs in accordance with said second control signal, and wherein the frequency of said second gate control signal is higher than the frequency of said first control signal.

4. A switching regulator soft start circuit comprising:
    timing means for receiving a start signal and generating an initial condition release signal after a predetermined time;
    frequency division means for receiving a signal of one frequency from a switching regulator and for providing an output signal at a lower frequency by a preselected factor;
    gating means for receiving switching regulator signals and a gate control signal and for outputting said switching regulator signals as modified by said control signal; and
    gate control means for receiving both frequency division means output and said initial condition release signal, and for generating a gate control signal in response thereto which places said gate in an on condition as long as said initial condition release signal is on and in an oscillating on and off condition with a frequency corresponding to an output signal of said frequency division means when said initial condition release signal is off.

5. The switching regulator soft start circuit of claim 4 further comprising:
    a frequency divider configured to subject said switching regulator signals to multiple frequency divisions so as to deliver a plurality of frequency divided outputs;
    means for generating a first control signal;
    a gate control circuit connected to receive the frequency divided outputs from said frequency divider circuit, said initial condition release signal, and said first control signal, and to generate a gate control signal by combining said frequency divided outputs in accordance with said first control signal when said initial condition release signal is present, and to generate a fixed gate control signal for delivering said switching regulator signals when said initial condition release signal is absent; and
    a gate circuit for receiving said switching regulator signal and said gate control signal and for outputting said switching regulator signal in response to said gate control signal.

6. The switching regulator soft start circuit of claim 5, wherein:
    said gate control circuit is further connected to receive a second control signal; and said gate control circuit configured to logically combine said plurality of frequency divided outputs in accordance with said first control signal when said initial condition release signal is off, and to deliver a second gate control signal produced by combining said plurality of frequency divided outputs in accordance with said second control signal, with the frequency of said second gate control signal selected to be higher than the frequency of said first control signal.

7. The switching regulator soft start circuit of claim 6 further comprising initial selection means connected to said gate control means for generating said first control signal for selecting an output frequency corresponding to one of said lower frequencies.

8. The switching regulator soft start circuit of claim 6 further comprising steadystate means connected to said gate control means for generating said second control signal for selecting said switching regulator output or a divided frequency thereof as an output.

* * * * *